(12) United States Patent
Joo et al.

(10) Patent No.: US 12,308,808 B2
(45) Date of Patent: May 20, 2025

(54) SEMICONDUCTOR DEVICE AND COMMUNICATION DEVICE INCLUDING THE SAME

(71) Applicant: Samsung Electronics Co., Ltd., Suwon-si (KR)

(72) Inventors: Seong Won Joo, Seoul (KR); Surin Gweon, Suwon-si (KR); Jeong Kyun Woo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 360 days.

(21) Appl. No.: 17/881,734

(22) Filed: Aug. 5, 2022

(65) Prior Publication Data

US 2023/0117533 A1     Apr. 20, 2023

(30) Foreign Application Priority Data

Oct. 20, 2021  (KR) ................. 10-2021-0140288
Apr. 20, 2022  (KR) ................. 10-2022-0048678

(51) Int. Cl.
*H03F 3/45*     (2006.01)
*H04B 1/40*     (2015.01)

(52) U.S. Cl.
CPC .......... *H03F 3/45475* (2013.01); *H04B 1/40* (2013.01); *H03F 2200/129* (2013.01); *H03F 2200/451* (2013.01)

(58) Field of Classification Search
CPC ............. H03F 1/14; H03F 2200/129; H03F 2200/451; H03F 2200/75; H03F 2203/45051; H03F 2203/45134; H03F 2203/45434; H03F 2203/45526; H03F 3/195; H03F 3/213; H03F 3/45188; H03F 3/45475; H03F 3/4565; H04B 1/40
See application file for complete search history.

(56) References Cited

U.S. PATENT DOCUMENTS

| | | |
|---|---|---|
| 6,329,849 B1 | 12/2001 | Czarnul et al. |
| 6,573,791 B2 | 6/2003 | Sridhar |
| 7,453,319 B2 | 11/2008 | Gupta et al. |
| 8,319,554 B1 | 11/2012 | Das |
| 8,963,639 B2 | 2/2015 | Yan et al. |
| 9,553,548 B2 | 1/2017 | Park et al. |

(Continued)

*Primary Examiner* — Timothy X Pham
(74) *Attorney, Agent, or Firm* — Harness, Dickey & Pierce, P.L.C.

(57) ABSTRACT

A semiconductor device includes a first amplifier configured to amplify a first input signal and a second input signal and output a first amplified signal and a second amplified signal, a second amplifier configured to receive and amplify the first amplified signal and the second amplified signal and output a first output signal and a second output signal, a feedforward circuit configured to receive the first input signal and the second input signal and perform feedforward control on the first output signal and second output signal, and a common-mode feedback circuit configured to receive the first output signal and the second output signal and output a feedback signal configured to adjust an average of the first output signal and the second output signal to correspond to a reference signal, and the common-mode feedback circuit configured to supply the feedback signal to the first amplifier and the feedforward circuit.

17 Claims, 7 Drawing Sheets

(56) References Cited

U.S. PATENT DOCUMENTS

| | | | |
|---|---|---|---|
| 9,912,311 B2 | 3/2018 | Kang et al. | |
| 10,263,568 B2 | 4/2019 | Harrison | |
| 10,797,662 B2 | 10/2020 | Joo et al. | |
| 2016/0308497 A1* | 10/2016 | Park | G05F 1/625 |
| 2019/0305739 A1* | 10/2019 | Joo | H03F 3/45659 |
| 2022/0263479 A1* | 8/2022 | Park | H03F 3/45179 |

* cited by examiner

SEMICONDUCTOR DEVICE AND COMMUNICATION DEVICE INCLUDING THE SAME

This application claims priority from Korean Patent Application No. 10-2021-0140288 filed on Oct. 20, 2021, and Korean Patent Application No. 10-2022-0048678 filed on Apr. 20, 2022, in the Korean Intellectual Property Office, the disclosures of which are incorporated herein by reference in their entirety.

BACKGROUND

Some example embodiments of the inventive concepts relate to a semiconductor device and/or a communication device including the same.

In analog communication systems, there is an increasing demand for devices that have low power consumption and may be reduced or miniaturized. Also, since a high data transmission rate is desired or required, there is an increasing demand for devices having a wide bandwidth.

SUMMARY

Some example embodiments of the inventive concepts provide a semiconductor device that may be reduced or miniaturized and also may stably operate and a communication device including the same.

It should be noted that example embodiments are not limited to the above-described objects, and other objects which have not been described will be apparent from the following descriptions.

According to some example embodiments of the inventive concepts, a semiconductor device includes a first amplifier configured to amplify a first input signal and a second input signal and output a first amplified signal and a second amplified signal, a second amplifier configured to receive and amplify the first amplified signal and the second amplified signal and output a first output signal and a second output signal, a feedforward circuit configured to receive the first input signal and the second input signal and perform feedforward control on the first output signal and second output signal, and a common-mode feedback circuit configured to receive the first output signal and the second output signal and output a feedback signal configured to adjust an average of the first output signal and the second output signal to correspond to a reference signal, and the common-mode feedback circuit configured to supply the feedback signal to the first amplifier and the feedforward circuit.

According to some example embodiments of the inventive concepts, a semiconductor device includes a first amplifier including a first transistor configured to turn on according to a first input signal, a second transistor configured to turn on according to a second input signal, a third transistor connected to one end of the first transistor and configured to turn on according to a feedback signal, and a fourth transistor connected to one end of the second transistor and configured to turn on according to the feedback signal. The device includes a feedforward circuit including a fifth transistor configured to turn on according to the first input signal, a sixth transistor configured to turn on according to the second input signal, a seventh transistor connected to one end of the fifth transistor and configured to turn on according to a bias signal, and an eighth transistor connected to the one end of the second transistor and configured to turn on according to the feedback signal. The device includes a second amplifier including a ninth transistor having a gate terminal connected between the first transistor and the third transistor and a drain terminal configured to receive a first output signal and a tenth transistor having a gate terminal connected between the second transistor and the fourth transistor and a drain terminal configured to receive a second output signal. The device includes a common-mode feedback circuit configured to receive the first output signal and the second output signal and output the feedback signal configured to adjust an average of the first output signal and the second output signal to correspond to a reference signal.

According to some example embodiments of the inventive concepts, a communication device includes a reception mixer configured to down-convert an output of a low-noise amplifier, an output of the reception mixer including a first input signal and a second input signal, and a reception amplifier configured to amplify the output of the reception mixer and output the amplified output. The reception amplifier incudes an amplifier configured to amplify the first input signal and the second input signal and output a first output signal and a second output signal, a common-mode feedback circuit configured to receive the first output signal and the second output signal and output a feedback signal configured to adjust an average of the first output signal and the second output signal to correspond to a reference signal, and a feedforward circuit configured to receive the first input signal and the second input signal and the feedback signal and perform feedforward control on the first output signal and the second output signal on a basis of the first input signal and the second input signal and the feedback signal. The device includes a reception filter configured to filter the output of the reception amplifier.

DETAILED DESCRIPTION OF SOME EXAMPLE EMBODIMENTS

Hereinafter, example embodiments according to the inventive concepts will be described with reference to the accompanying drawings.

Figure 1:
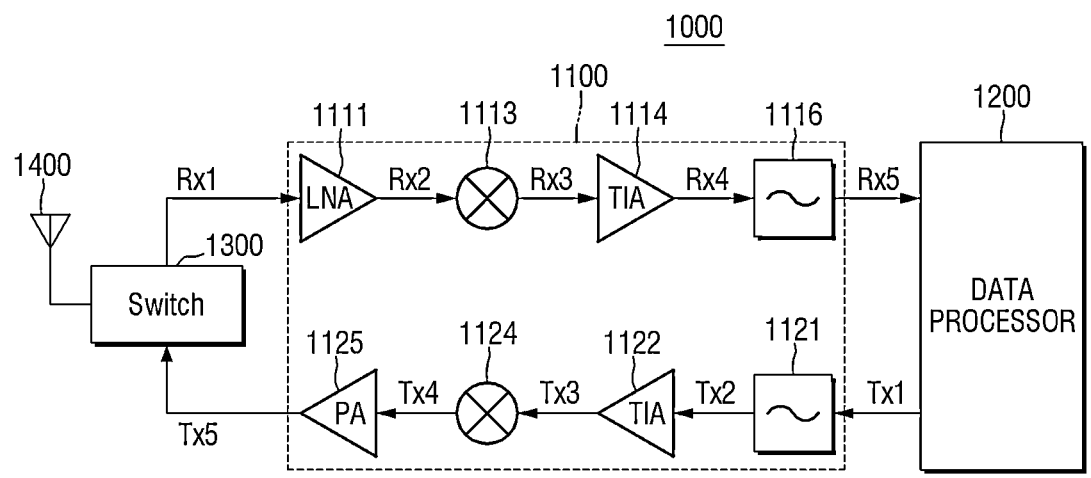
FIG. 1 is a block diagram of a communication device according to some example embodiments.

FIG. 1 is a block diagram of a communication device according to some example embodiments.

Referring to FIG. 1, a communication device 1000 may include a transceiver 1100, a data processor 1200, a switch 1300, and an antenna 1400.

The transceiver 1100 may include a low-noise amplifier 1111, a reception mixer 1113, a reception amplifier 1114, a reception filter 1116, a transmission filter 1121, a transmission amplifier 1122, a transmission mixer 1124, and a power amplifier 1125.

In a reception mode, the switch 1300 may output a first reception signal Rx1 received through the antenna 1400 to the low-noise amplifier 1111. The low-noise amplifier 1111 may amplify the first reception signal Rx1 to generate a second reception signal Rx2. The reception mixer 1113 may down-convert the second reception signal Rx2 to generate a third reception signal Rx3.

The reception amplifier 1114 may amplify the third reception signal Rx3 to generate a fourth reception signal Rx4. In some example embodiments, the reception filter 1116 may filter the fourth reception signal Rx4 to generate and output a fifth reception signal Rx5 to the data processor 1200.

In some example embodiments, the reception amplifier 1114 may include a transimpedance amplifier (TIA), and the reception amplifier 1114 and the reception filter 1116 may serve to convert a radio frequency (RF) current signal, which has been down-converted through the reception mixer 1113, into an intermediate frequency (IF) voltage signal and filter the IF voltage signal.

In a transmission mode, the data processor 1200 may generate and output a first transmission signal Tx1 to the transceiver 1100. The transmission filter 1121 may filter the first transmission signal Tx1 to generate a second transmission signal Tx2, and the transmission amplifier 1122 may amplify the second transmission signal Tx2 to generate a third transmission signal Tx3. In some example embodiments, the transmission amplifier 1122 may include a TIA.

The transmission mixer 1124 may up-convert the third transmission signal Tx3 to generate a fourth transmission signal Tx4, and the power amplifier 1125 may amplify the fourth transmission signal Tx4 to generate a fifth transmission signal Tx5. The switch 1300 may connect the power amplifier 1125 to the antenna 1400, and the fifth transmission signal Tx5 may be externally output through the antenna 1400.

Figure 2:
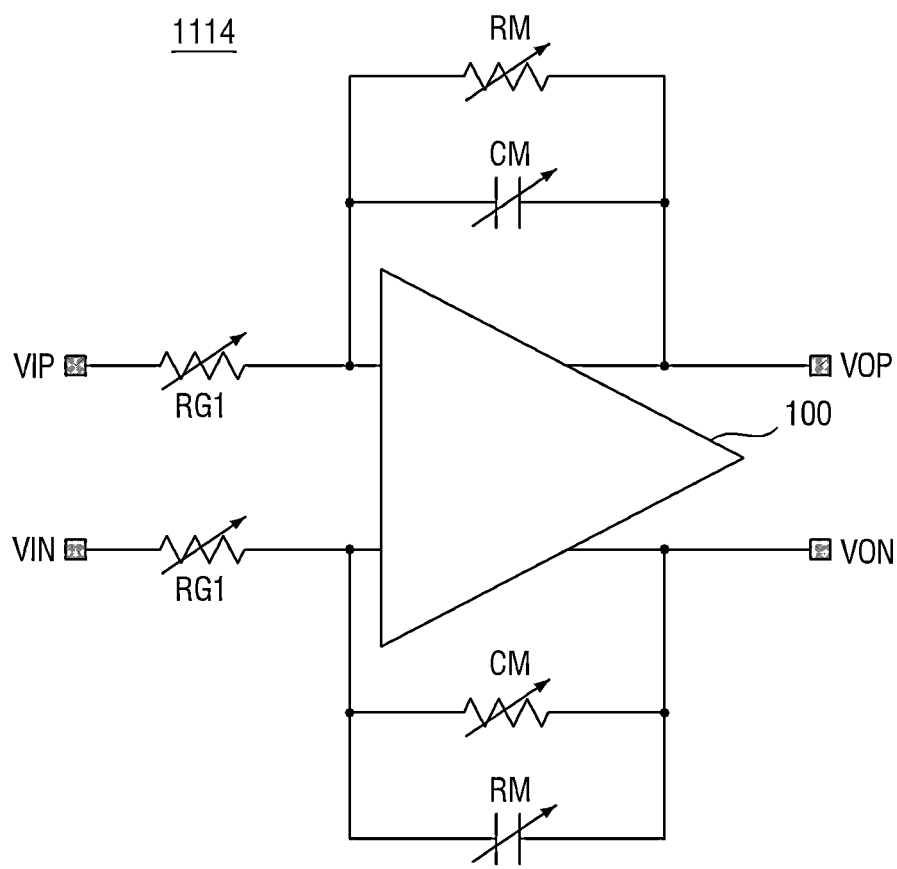
FIG. 2 is a circuit diagram illustrating a reception amplifier of FIG. 1.

FIG. 2 is a circuit diagram illustrating the reception amplifier of FIG. 1.

Referring to FIG. 2, the reception amplifier 1114 may include an amplifier 100 which receives input signals VIP and VIN through input resistors RG1 and feedback resistors RM and feedback capacitors CM which are connected in parallel to an input end and an output end of the amplifier 100.

A configuration of the reception amplifier 1114 of FIG. 1 will be described here, but the transmission amplifier (e.g., 1122 of FIG. 1) may have the same configuration as will be described below.

The input signals VIP and VIN provided to the amplifier 100 may be amplified by the amplifier 100 and output as output signals VOP and VON. In some example embodiments, the input signals VIP and VIN may be, for example, differential signals, but example embodiments are not limited thereto. Also, the amplifier 100 may include an operational transconductance amplifier (OTA), but example embodiments are not limited thereto.

The input resistors RG1 and the feedback resistors RM may include, for example, a variable resistor. When the resistance levels of the input resistors RG1 and the feedback resistors RM are changed, the gain and cutoff frequency of the reception amplifier 1114 may be changed.

For example, the cutoff frequency of the reception amplifier 1114 may have a characteristic of being inversely proportional to the resistance levels of the feedback resistors RM.

In other words, when the resistance levels of the feedback resistors RM increase, the cutoff frequency of the reception amplifier 1114 decreases such that the reception amplifier 1114 may operate as a narrowband filter which passes input signals having a low frequency.

Also, when the resistance levels of the feedback resistors RM decrease, the cutoff frequency of the reception amplifier 1114 increases such that the reception amplifier 1114 may operate as a wideband filter which passes input signals having a high frequency.

When the resistance levels of the feedback resistors RM are maintained within a certain section, the reception amplifier 1114 may operate as a middle-band filter which passes input signals having a frequency between a first frequency and a second frequency.

In some example embodiments, the feedback resistors RM and the feedback capacitors CM may be controlled by, for example, digital code to increase or decrease linearly, exponentially, etc.

Figure 3:
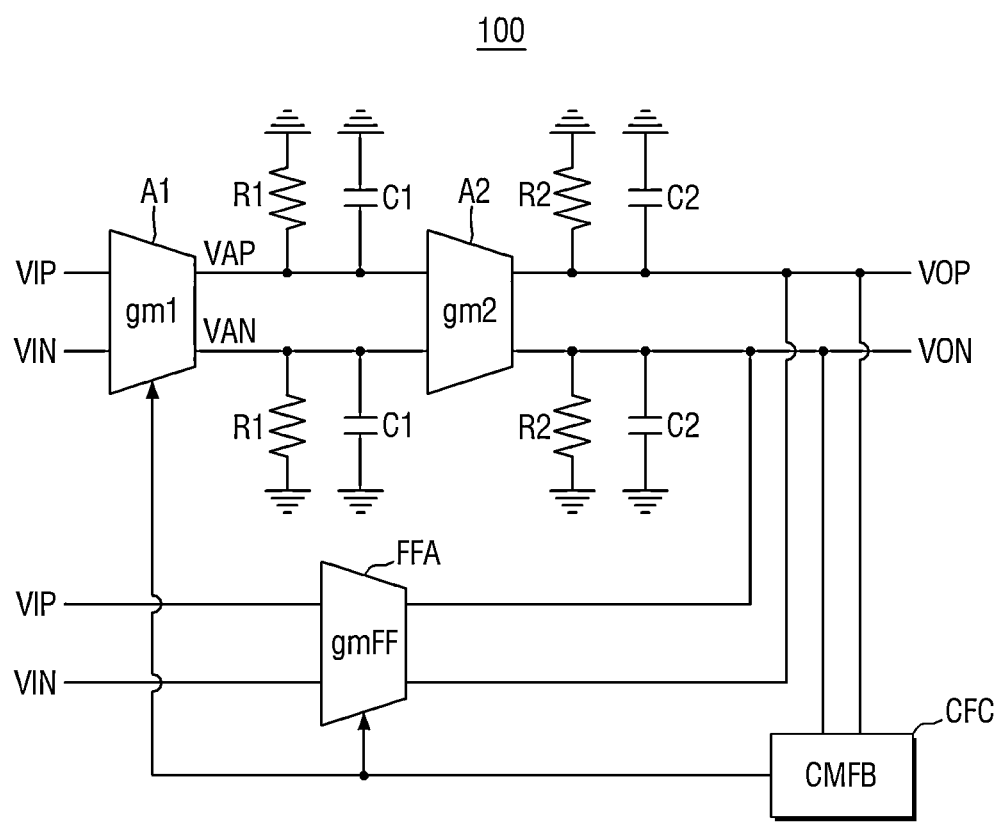
FIG. 3 is a block diagram illustrating an amplifier of FIG. 2.
Figure 4:
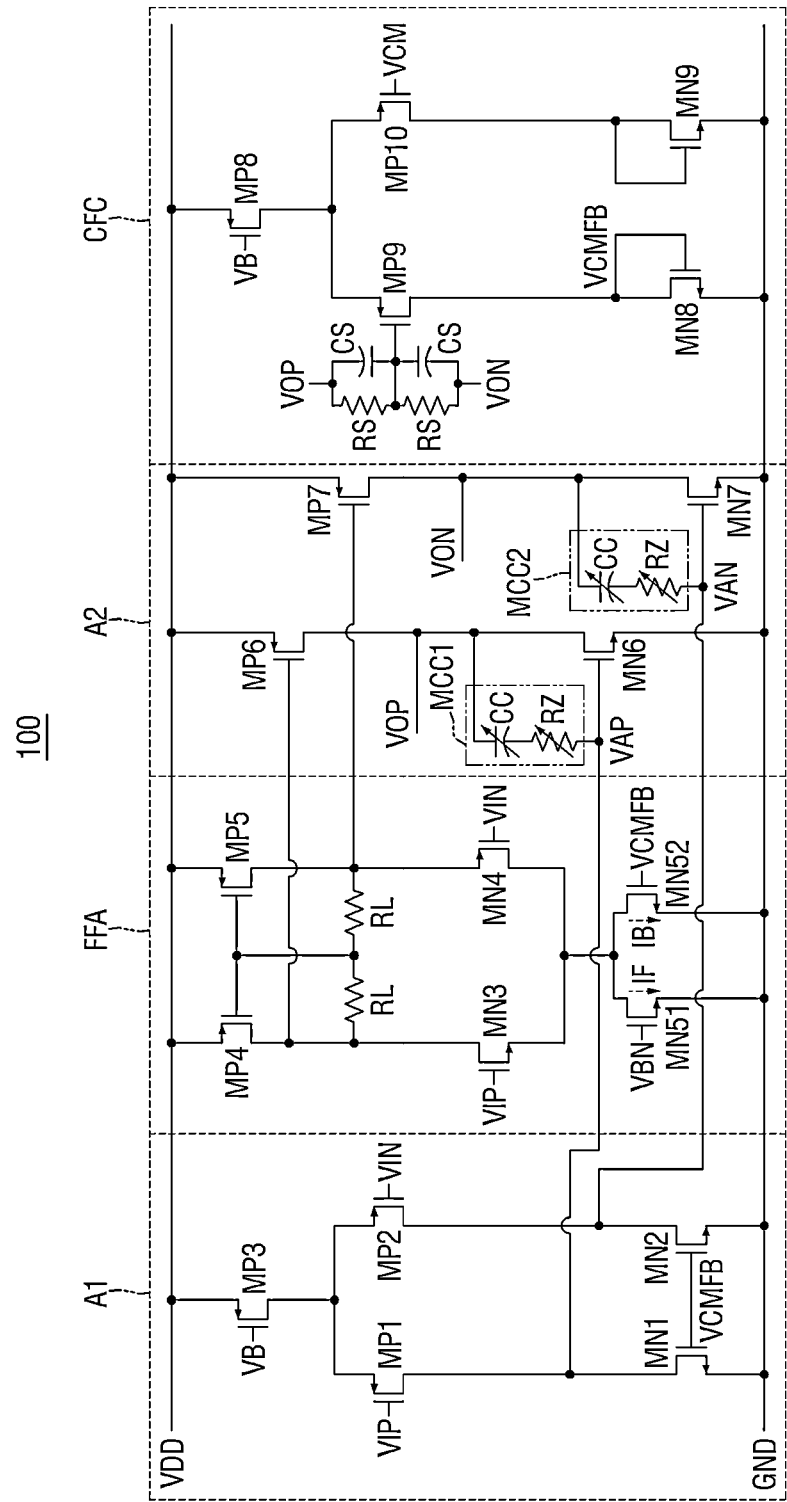
FIG. 4 is a circuit diagram of the amplifier of FIG. 2.

FIG. 3 is a block diagram illustrating an amplifier of FIG. 2. FIG. 4 is a circuit diagram of the amplifier of FIG. 2.

Referring to FIGS. 3 and 4, the amplifier 100 may include a first amplifier A1, a second amplifier A2, a feedforward circuit FFA, and a common-mode feedback circuit CFC.

Resistors R1 and R2 and capacitors C1 and C2 shown in FIG. 3 represent resistance components and capacitance components on a path in the amplifier 100.

The first amplifier A1 may amplify the first input signal VIP and the second input signal VIN for the first time and output a first amplified signal VAP and a second amplified signal VAN.

The first amplifier A1 may include a bias transistor which is turned on by a bias voltage VB, a transistor MP1 which is turned on by the first input signal VIP, a transistor MP2 which is turned on by the second input signal VIN, and transistors MN1 and MN2 which are turned on by a feedback signal VCMFB.

The source terminal of a bias transistor MP3 may be connected to a power supply voltage VDD, and the drain terminal of the bias transistor MP3 may be connected to the source terminals of the transistors MP1 and MP2. The bias voltage VB may be provided to the gate terminal of the bias transistor MP3.

The first input signal VIP may be provided to the gate terminal of the transistor MP1, and the drain terminal of the transistor MP1 may be connected to the drain terminal of the transistor MN1. The second input signal VIN may be provided to the gate terminal of the transistor MP2, and the drain terminal of the transistor MP2 may be connected to the drain terminal of the transistor MN2.

The feedback signal VCMFB may be provided to the gate terminal of the transistor MN1, and the source terminal of the transistor MN1 may be grounded. The feedback signal VCMFB may be provided to the gate terminal of the transistor MN2, and the source terminal of the transistor MN2 may be grounded.

In some example embodiments, the bias transistor MP3 and the transistors MP1 and MP2 may include a P-type transistor, and the transistors MN1 and MN2 may include an N-type transistor, but example embodiments are not limited thereto.

The first input signal VIP may be amplified for the first time by a bias current, which is generated when the transistor MP1 is turned on by the first input signal VIP and the transistor MN1 is turned on by the feedback signal VCMFB, such that the first amplified signal VAP may be generated. The generated first amplified signal VAP may be transferred to the second amplifier A2 (e.g., the gate terminal of a transistor MN6).

The second input signal VIN may be amplified for the first time by a bias current, which is generated when the transistor MP2 is turned on by the second input signal VIN and the transistor MN2 is turned on by the feedback signal VCMFB, such that the second amplified signal VAN may be generated. The generated second amplified signal VAN may be transferred to the second amplifier A2 (e.g., the gate terminal of a transistor MN7).

The second amplifier A2 may amplify the first amplified signal VAP and the second amplified signal VAN for the second time and output a first output signal VOP and a second output signal VON.

The second amplifier A2 may include a transistor MP6 which is used by the feedforward circuit FFA to perform feedforward control on the first output signal VOP, a transistor MP7 which is used by the feedforward circuit FFA to perform feedforward control on the second output signal VON, the transistor MN6 which is turned on by the first amplified signal VAP output from the first amplifier A1, and the transistor MN7 which is turned on by the second amplified signal VAN output from the first amplifier A1.

The source terminal of the transistor MP6 may be connected to the power supply voltage VDD, and the drain terminal of the transistor MP6 may be connected to the drain terminal of the transistor MN6. The gate terminal of the transistor MP6 may be connected to the drain terminal of a transistor MP4 of the feedforward circuit FFA.

The source terminal of the transistor MP7 may be connected to the power supply voltage VDD, and the drain terminal of the transistor MP7 may be connected to the drain terminal of the transistor MN7. The gate terminal of the transistor MP7 may be connected to the drain terminal of a transistor MP5 of the feedforward circuit FFA.

The source terminal of the transistor MN6 may be grounded, and the drain terminal of the transistor MN6 may be connected to the drain terminal of the transistor MP6. The first output signal VOP may be output through the drain terminal of the transistor MN6. The gate terminal of the transistor MN6 may be connected to the drain terminals of the transistor MP1 and the transistor MN1 of the first amplifier A1.

The source terminal of the transistor MN7 may be grounded, and the drain terminal of the transistor MN7 may be connected to the drain terminal of the transistor MP7. The second output signal VON may be output through the drain terminal of the transistor MN7. The gate terminal of the transistor MN7 may be connected to the drain terminals of the transistor MP2 and the transistor MN2 of the first amplifier A1.

In some example embodiments, the transistors MP7 and MP6 may include a P-type transistor, and the transistors MN7 and MN6 may include an N-type transistor, but example embodiments are not limited thereto.

In some example embodiments, the second amplifier A2 may include a first Miller compensation circuit MCC1 and a second Miller compensation circuit MCC2 which include a variable resistor RZ and a variable capacitor CC.

When the second amplifier A2 includes the first Miller compensation circuit MCC1 and the second Miller compensation circuit MCC2, the first Miller compensation circuit MCC1 and the second Miller compensation circuit MCC2 may be added between the input terminal and output terminal of the second amplifier A2 shown in FIG. 3.

The first Miller compensation circuit MCC1 may be connected between the gate terminal and drain terminal of the transistor MN6 to perform a compensation operation. The second Miller compensation circuit MCC2 may be connected between the gate terminal and drain terminal of the transistor MN7 to perform a compensation operation.

In some example embodiments, the amplifier 100 may include a common-mode feedback circuit CFC and the first and second Miller compensation circuits MCC1 and MCC2 that perform dominant pole compensation using the Miller effect. Accordingly, it is possible to sufficiently increase the gain of the common-mode feedback circuit CFC without degrading the stability of the whole system, and thus the amplifier 100 can stably operate in a common mode.

The first amplified signal VAP may be amplified for the second time by a bias current that is generated when the transistor MN6 is turned on by the first amplified signal VAP generated by the transistor MP1 and the transistor MN1 of the first amplifier A1, and thus the first output signal VOP may be generated. Also, the first output signal VOP may be generated by a bias current that is generated when the transistor MP6 is turned on by an output of the feedforward circuit FFA. In other words, the first output signal VOP may be generated by operations of the transistor MN6, which is a portion of an amplification path, and the transistor MP6, which is a portion of a feedforward path.

Also, the second amplified signal VAN may be amplified for the second time by a bias current that is generated when the transistor MN7 is turned on by the second amplified signal VAN generated by the transistor MP2 and the transistor MN2 of the first amplifier A1, and thus the second output signal VON may be generated. Also, the second output signal VON may be generated by a bias current that is generated when the transistor MP7 is turned on by an output of the feedforward circuit FFA. In other words, the second output signal VON may be generated by operations of the transistor MN7, which is a portion of the amplification path, and the transistor MP7, which is a portion of the feedforward path.

The common-mode feedback circuit CFC may receive the first output signal VOP and the second output signal VON and output the feedback signal VCMFB for adjusting the average of the first output signal VOP and the second output signal VON to correspond to a reference signal VCM.

When there is no difference between the first input signal VIP and the second input signal VIN which are differential signals in the amplifier 100, the first output signal VOP and the second output signal VON of the amplifier 100 are desired or required to be at an intermediate level of an entire voltage swing range. However, due to power, the temperature, a change of a manufacturing process, a change between an input common mode and an output common mode of the amplifier 100 or a change of the output common mode caused by noise, etc., the output of the amplifier 100 may be biased to a level other than the intermediate level, and the operation of the amplifier 100 may be limited.

For this reason, the common-mode feedback circuit CFC may be used. The common-mode feedback circuit CFC is a negative feedback circuit that may detect a common-mode voltage of the amplifier 100, compare the detected common-mode voltage with a reference voltage, and make the detected common-mode voltage close to the reference voltage according to the comparison result.

The common-mode feedback circuit CFC may be used at the output terminal of the amplifier 100 to set a common mode of differential output signals.

The common-mode feedback circuit CFC may include a bias transistor MP8 which is turned on by the bias voltage VB, a transistor MP9 which is turned on by the average of the first output signal VOP and the second output signal VON, a transistor MP10 which is turned on by the reference signal VCM, a transistor MN8 which is turned on by an output of the drain terminal of the transistor MP9, and a transistor MN9 which is turned on by an output of the drain terminal of the transistor MP10.

The source terminal of the bias transistor MP8 may be connected to the power supply voltage VDD, and the drain terminal of the bias transistor MP8 may be connected to the source terminals of the transistors MP9 and MP10. The bias voltage VB may be provided to the gate terminal of the bias transistor MP8.

The average of the first output signal VOP and the second output signal VON may be provided to the gate terminal of the transistor MP9 by resistors RS and capacitors CS. The drain terminal of the transistor MP9 may be connected to the drain terminal of the transistor MN8. The reference signal VCM may be provided to the gate terminal of the transistor MP10, and the drain terminal of the transistor MP10 may be connected to the drain terminal of the transistor MN9.

The gate terminal of the transistor MN8 may be connected to the drain terminal of the transistor MN8, and the feedback signal VCMFB may be output through the drain terminal of the transistor MN8. The source terminal of the transistor MN8 may be grounded. The gate terminal of the transistor MN9 may be connected to the drain terminal of the transistor MN8, and the source terminal of the transistor MN9 may be grounded.

In some example embodiments, the bias transistor MP8 and the transistors MP9 and MP10 may include a P-type transistor, and the transistors MN8 and MN9 may include an N-type transistor, but example embodiments are not limited thereto.

The transistors MP9, MP10, MN8, and MN9 may generate the feedback signal VCMFB for adjusting the average of the first output signal VOP and the second output signal VON to correspond to the reference signal VCM, and the generated feedback signal VCMFB may be provided to the first amplifier A1 and the feedforward circuit FFA.

The feedforward circuit FFA may receive the first input signal VIP and the second input signal VIN and perform feedforward control on the first output signal VOP and the second output signal VON.

The feedforward circuit FFA may include the transistor MP4 used for performing feedforward control on the first output signal VOP, the transistor MP5 used for performing feedforward control on the second output signal VON, a transistor MN3 which is turned on by the first input signal VIP, a transistor MN4 which is turned on by the second input signal VIN, a transistor MN51 which controls a fixed current IF to flow into the feedforward circuit FFA while the feedforward circuit FFA is enabled, and a transistor MN52 which controls a bias current IB based on the feedback signal VCMFB to flow into the feedforward circuit FFA while the feedforward circuit FFA is enabled.

The source terminal of the transistor MP4 may be connected to the power supply voltage VDD, and the drain terminal of the transistor MP4 may be connected to a resistor RL and the drain terminal of the transistor MN3. The gate terminal of the transistor MP4 may be connected to the resistor RL and the gate terminal of the transistor MP5. The drain terminal of the transistor MP4 may be connected to the gate terminal of the transistor MP6 of the second amplifier A2 such that feedforward control may be performed.

The source terminal of the transistor MP5 may be connected to the power supply voltage VDD, and the drain terminal of the transistor MP5 may be connected to a resistor RL and the drain terminal of the transistor MN4. The gate terminal of the transistor MP5 may be connected to the resistor RL and the gate terminal of the transistor MP4. The drain terminal of the transistor MP5 may be connected to the gate terminal of the transistor MP7 of the second amplifier A2 such that feedforward may be performed.

The first input signal VIP may be provided to the gate terminal of the transistor MN3, and the source terminal of the transistor MN3 may be connected to the drain terminal of the transistor MN51 and the drain terminal of the transistor MN52.

The second input signal VIN may be provided to the gate terminal of the transistor MN4, and the source terminal of the transistor MN4 may be connected to the drain terminal of the transistor MN51 and the drain terminal of the transistor MN52.

The source terminal of the transistor MN51 may be grounded, and the drain terminal of the transistor MN51 may be connected to the drain terminal of the transistor MN3. The bias voltage VBN may be provided to the gate terminal of the transistor MN51, and while the feedforward circuit FFA is enabled, the transistor MN51 may be turned on by the bias voltage VBN to control the fixed current IF to flow into the feedforward circuit FFA. In other words, while the feedforward circuit FFA is enabled, the transistor MN51 may stay turned on so that the fixed current IF flows into the feedforward circuit FFA.

The source terminal of the transistor MN52 may be grounded, and the drain terminal of the transistor MN52 may be connected to the drain terminal of the transistor MN4. The feedback signal VCMFB may be provided to the gate terminal of the transistor MN52, and while the feedforward circuit FFA is enabled, the transistor MN52 may be turned on by the feedback signal VCMFB provided by the common-mode feedback circuit CFC to control the bias current IB to flow into the feedforward circuit FFA. In other words, while the feedforward circuit FFA is enabled, the transistor MN52 may control the bias current IB having a variable level to flow on the basis of the feedback signal VCMFB provided to the feedforward circuit FFA by the common-mode feedback circuit CFC.

In some example embodiments, the transistors MP4 and MP5 may include a P-type transistor, and the transistors MN3, MN4, MN51, and MN52 may include an N-type transistor, but example embodiments are not limited thereto.

FIGS. 5 to 8 are diagrams illustrating effects of a reception amplifier according to some example embodiments.

Figure 5:
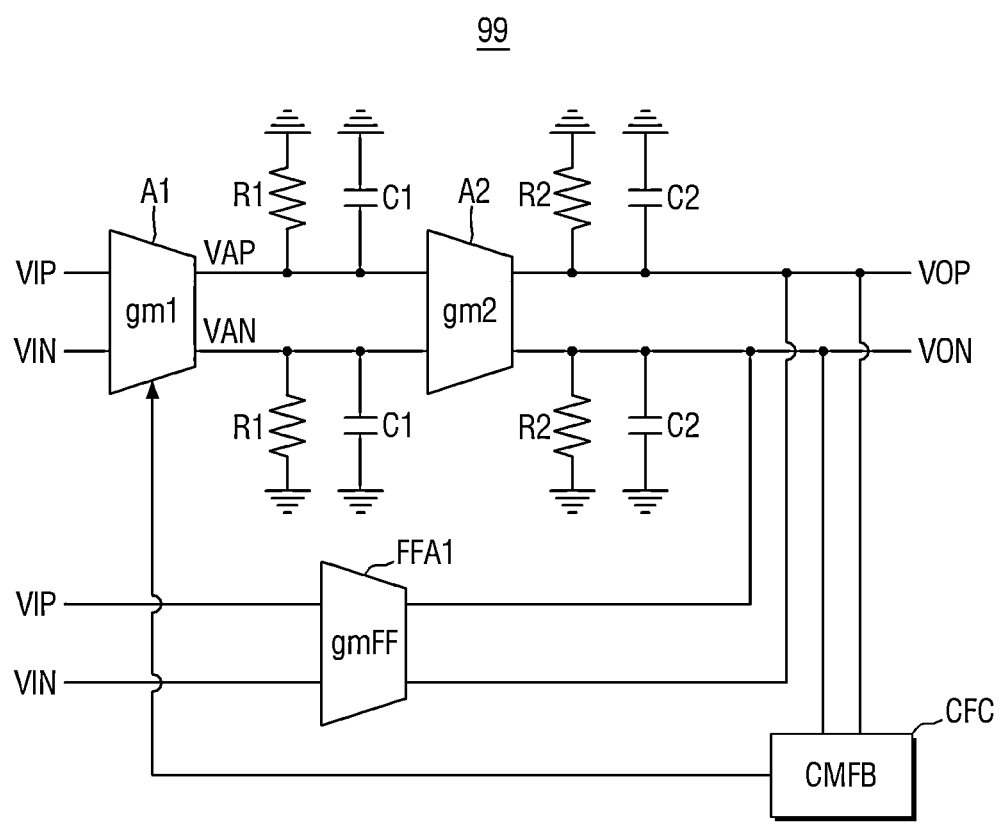
FIGS. 5, 6, 7 and 8 are diagrams illustrating effects of a reception amplifier according to some example embodiments.
Figure 6:
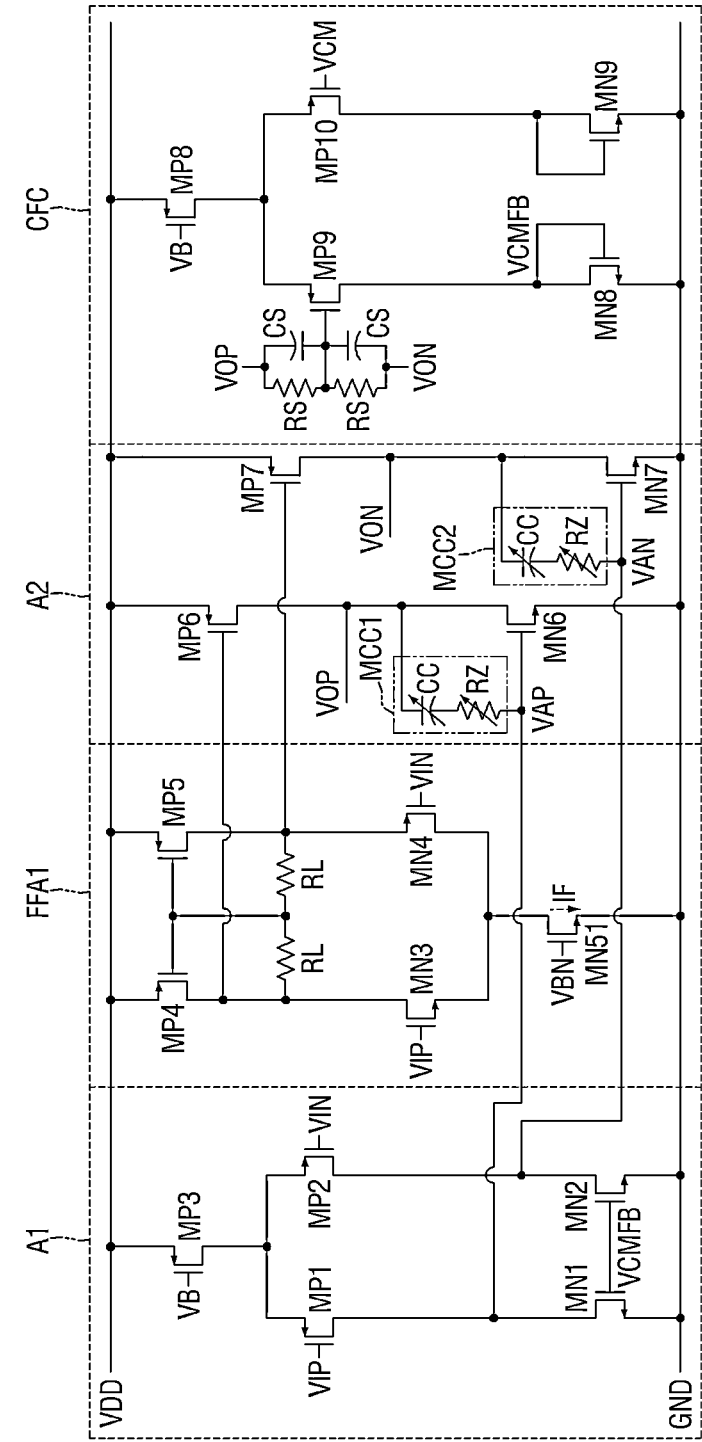
Figure 7:
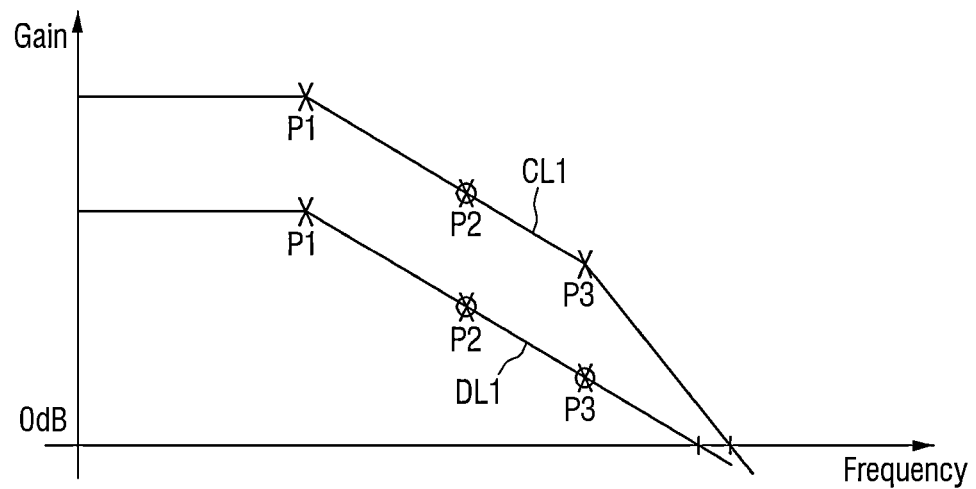

First, FIG. 5 is a block diagram of a another example embodiment of an amplifier. FIG. 6 is a circuit diagram of FIG. 5. FIG. 7 is a graph showing an example frequency response characteristic of the amplifier shown in FIGS. 5 and 6.

Referring to FIG. 5, a feedforward circuit FFA1 of an amplifier 99 does not receive a feedback signal VCMFB from a common-mode feedback circuit CFC. In other words, the feedback signal VCMFB which is an output from the common-mode feedback circuit CFC is not taken into consideration for the feedforward circuit FFA1 of the amplifier 99 to perform feedforward control.

Referring to FIG. 6, the feedforward circuit FFA1 of the amplifier 99 may only include a transistor MN51 that is turned on by a bias voltage VBN to control a fixed current IF to flow into the feedforward circuit FFA1 while the feedforward circuit FFA1 is enabled.

In this case, due to the impedance of the amplifier 99, the frequency response characteristic of the amplifier 99 shows a gain difference between a common-mode loop CL1 and a differential-mode loop DLL In the case of the differential-mode loop DL1, a pole P2 is nulled by first and second Miller compensation circuits MCC1 and MCC2, and a pole P3 is nulled by the feedforward circuit FFA1. Accordingly, the characteristic of a one-pole system can be achieved.

On the other hand, in the case of the common-mode loop CL1, the pole P2 may be nulled by the first and second Miller compensation circuits MCC1 and MCC2, but the pole P3 is not nulled. Accordingly, there may be a problem such as the circuit oscillating due to the characteristic of a two-pole system having two poles.

Figure 8:
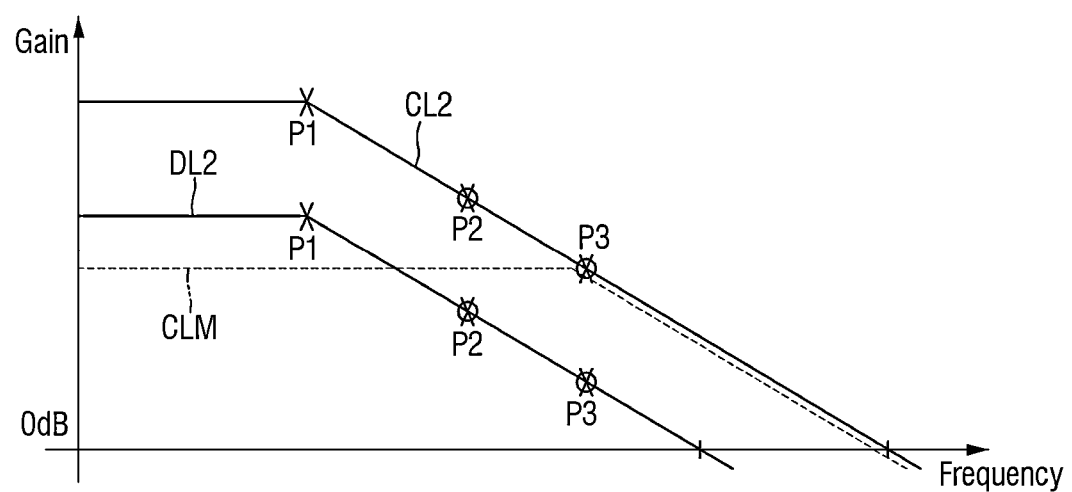

FIG. 8 is a graph showing a frequency response characteristic of the amplifier according to some example embodiments.

As described above with reference to FIG. 3, the feedforward circuit FFA of the amplifier 100 receives the feedback signal VCMFB from the common-mode feedback circuit CFC and perform feedforward control on the basis of the feedback signal VCMFB. In other words, the feedforward circuit FFA of the amplifier 100 performs feedforward control in consideration of the feedback signal VCMFB which is the output from the common-mode feedback circuit CFC.

As shown in FIG. 4, the feedforward circuit FFA of the amplifier 100 includes the transistor MN51 which is turned on by the bias voltage VBN to control the fixed current IF to flow into the feedforward circuit FFA while the feedforward circuit FFA is enabled and a transistor MN52 which is turned on by the feedback signal VCMFB provided by the common-mode feedback circuit CFC to control the bias current IB to flow into the feedforward circuit FFA while the feedforward circuit FFA is enabled.

Accordingly, as shown in FIG. 8, a loop CLM of a new response characteristic is added to the frequency response characteristic of the amplifier, and thus a common-mode loop CL2 can have the characteristic of a one-pole system.

Specifically, in the case of a differential-mode loop DL2, a pole P2 is nulled by the first and second Miller compensation circuits MCC1 and MCC2, and a pole P3 is nulled by the feedforward circuit FFA. Accordingly, the characteristic of a one-pole system can be achieved.

Also, in the case of the common-mode loop CL2, the pole P2 is nulled by the first and second Miller compensation circuits MCC1 and MCC2, and the pole P3 is nulled by the feedforward circuit FFA which performs feedforward control on the basis of the feedback signal VCMFB provided by the common-mode feedback circuit CFC. Accordingly, the characteristic of a one-pole system can be achieved.

In this way, the reception amplifier according to the some example embodiments has the characteristic of a one-pole system in both the differential-mode loop DL2 and the common-mode loop CL2, and thus can stably operate.

Further, the sum of the sizes of the transistor MN51 and the transistor MN52 of the amplifier 100 according to the some example embodiments may be substantially the same as the size of the transistor 51 of the amplifier 99. For example, when the transistor MN51 of the amplifier 99 includes four unit transistors, the transistor MN51 of the amplifier 100 according to some example embodiments may include two unit transistors, and the transistor MN52 may include two unit transistors. Also, in some example embodiments, the transistor MN51 of the amplifier 100 according to may include one unit transistor, and the transistor MN52 may include three unit transistors, or the transistor MN51 of the amplifier 100 may include three unit transistors, and the transistor MN52 may include one unit transistor, etc.

In other words, no additional passive component is desired or necessary to improve the operational stability of the reception amplifier, and thus the reception amplifier can be reduced or miniaturized.

One or more of the elements disclosed above may include or be implemented in one or more processing circuitries such as hardware including logic circuits; a hardware/software combination such sa a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

Although some example embodiments of the inventive concepts have been described above with reference to the accompanying drawings, example embodiments are not limited thereto and can be manufactured in various different forms. It will be understood that example embodiments can be implemented in other specific, and the above-described example embodiments should be considered as illustrative rather than restrictive in all aspects.

What is claimed is:

1. A semiconductor device comprising:
a first amplifier configured to amplify a first input signal and a second input signal and output a first amplified signal and a second amplified signal;
a second amplifier configured to receive and amplify the first amplified signal and the second amplified signal and output a first output signal and a second output signal;
a feedforward circuit configured to receive the first input signal and the second input signal and perform feedforward control on the first output signal and second output signal; and
a common-mode feedback circuit configured to receive the first output signal and the second output signal and generate a feedback signal to adjust an average of the first output signal and the second output signal to correspond to a reference signal and output the feedback signal, and the common-mode feedback circuit configured to supply the feedback signal to the first amplifier and the feedforward circuit,
wherein the feedforward circuit includes a first transistor configured to receive a bias voltage to control a fixed current to flow into the feedforward circuit while the feedforward circuit is enabled, and a second transistor configured to receive the feedback signal from the common-mode feedback circuit to control a bias current having a variable level to flow into the feedforward circuit while the feedforward circuit is enabled.

2. The semiconductor device of claim 1, wherein the feedforward circuit comprises:
a third transistor configured to turn on according to the first input signal; and
a fourth transistor configured to turn on according to the second input signal,
wherein the first transistor is connected to one end of the third transistor and configured to turn on according to a first signal; and
wherein the second transistor is connected to one end of the fourth transistor and configured to turn on according to the feedback signal.

3. The semiconductor device of claim 2, wherein the first transistor is configured to turn on while the feedforward circuit is enabled.

4. The semiconductor device of claim 2, wherein
the first transistor is connected to the one end of the fourth transistor, and
the second transistor is connected to the one end of the third transistor.

5. The semiconductor device of claim 2, wherein the first amplifier comprises:
a fifth transistor configured to turn on according to the first input signal;
a sixth transistor configured to turn on according to the second input signal;
a seventh transistor connected to one end of the fifth transistor and configured to turn on according to the feedback signal; and
an eighth transistor connected to one end of the sixth transistor and configured to turn on according to the feedback signal.

6. The semiconductor device of claim 5, wherein the second amplifier comprises:
a ninth transistor having a gate terminal connected between the fifth transistor and the seventh transistor and a drain terminal configured to receive the first output signal; and
a tenth transistor having a gate terminal connected between the sixth transistor and the eighth transistor and a drain terminal configured to receive the second output signal.

7. The semiconductor device of claim 6, further comprising:
a first Miller compensation circuit connected between the gate terminal and the drain terminal of the ninth transistor; and
a second Miller compensation circuit connected between the gate terminal and the drain terminal of the tenth transistor.

8. The semiconductor device of claim 1, wherein the first input signal and the second input signal are differential signals.

9. The semiconductor device of claim 1, wherein the semiconductor device is an operational transconductance amplifier (OTA).

10. A semiconductor device comprising:
a first amplifier including a first transistor configured to turn on according to a first input signal, a second transistor configured to turn on according to a second input signal, a third transistor connected to one end of the first transistor and configured to turn on according to a feedback signal, and a fourth transistor connected to one end of the second transistor and configured to turn on according to the feedback signal;
a feedforward circuit including a fifth transistor configured to turn on according to the first input signal, a sixth transistor configured to turn on according to the second input signal, a seventh transistor connected to one end of the fifth transistor and configured to turn on according to a bias signal, and an eighth transistor connected to the one end of the second transistor and configured to turn on according to the feedback signal;
a second amplifier including a ninth transistor having a gate terminal connected between the first transistor and the third transistor and a drain terminal configured to receive a first output signal and a tenth transistor having a gate terminal connected between the second transistor and the fourth transistor and a drain terminal configured to receive a second output signal; and
a common-mode feedback circuit configured to receive the first output signal and the second output signal and generate a feedback signal to adjust an average of the first output signal and the second output signal to correspond to a reference signal and output the feedback signal.

11. The semiconductor device of claim 10, further comprising:
a first Miller compensation circuit connected between the gate terminal and the drain terminal of the ninth transistor; and
a second Miller compensation circuit connected between the gate terminal and the drain terminal of the tenth transistor.

12. The semiconductor device of claim 10, wherein
the seventh transistor is connected to one end of the sixth transistor, and
the eighth transistor is connected to the one end of the fifth transistor.

13. A communication device comprising:
a reception mixer configured to down-convert an output of a low-noise amplifier, an output of the reception mixer including a first input signal and a second input signal;
a reception amplifier configured to amplify the output of the reception mixer and output the amplified output, the reception amplifier including an amplifier configured to amplify the first input signal and the second input signal and output a first output signal and a second output signal, a common-mode feedback circuit configured to receive the first output signal and the second output signal and generate a feedback signal to adjust an average of the first output signal and the second output signal to correspond to a reference signal and output the feedback signal, and a feedforward circuit configured to receive the first input signal and the second input signal and the feedback signal and perform feedforward control on the first output signal and the second output signal on a basis of the first input signal and the second input signal and the feedback signal; and
a reception filter configured to filter the output of the reception amplifier,
wherein feedforward circuit includes a first transistor configured to receive a bias voltage to control a fixed current to flow into the feedforward circuit while the feedforward circuit is enabled, and a second transistor configured to receive the feedback signal from the common-mode feedback circuit to control a bias current having a variable level to flow into the feedforward circuit while the feedforward circuit is enabled.

14. The communication device of claim 13, wherein the amplifier comprises:
a first amplifier configured to receive the first input signal and the second input signal and the feedback signal, amplify the first input signal and the second input signal a first time on the basis of the first input signal and the second input signal and the feedback signal, and output a first amplified signal and a second amplified signal; and
a second amplifier configured to receive the first amplified signal and the second amplified signal, amplify the first amplified signal and the second amplified signal a second time, and output the first output signal and the second output signal.

15. The communication device of claim 14, wherein the feedforward circuit comprises:
a third transistor configured to turn on according to the first input signal; and
a fourth transistor configured to turn on according to the second input signal, wherein the first transistor is connected to ends of the third transistor and the fourth transistor and configured to turn on according to a bias signal, and where the second transistor is connected to the ends of the third transistor and the fourth transistor and configured to turn on according to the feedback signal.

16. The communication device of claim 13, wherein the amplifier comprises:

a first amplifier configured to receive the first input signal and the second input signal and the feedback signal, amplify the first input signal and the second input signal a first time, and output a first amplified signal and a second amplified signal; and a second amplifier configured to receive the first amplified signal and the second amplified signal, amplify the first amplified signal and the second amplified signal a second time, and output the first output signal and the second output signal.

17. The communication device of claim 13, wherein the reception amplifier includes a transimpedance amplifier (TIA), and the amplifier includes an operational transconductance amplifier (OTA).

\* \* \* \* \*